United States Patent
Macphail et al.

(10) Patent No.: US 6,603,335 B1
(45) Date of Patent: Aug. 5, 2003

(54) RAMP CIRCUIT TO REDUCE SPECTRAL REGROWTH OF POWER AMPLIFIERS

(75) Inventors: Phil Macphail, Cambridge (GB); Wei An, Nepean (CA)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 10/167,633

(22) Filed: Jun. 11, 2002

(51) Int. Cl.[7] .................................................. H03K 4/06
(52) U.S. Cl. ........................................................ 327/131
(58) Field of Search ................................ 327/131, 132, 327/133, 134, 135, 136, 170; 323/315; 330/253, 257, 307

(56) References Cited

U.S. PATENT DOCUMENTS

| | | |
|---|---|---|
| 5,408,133 A | 4/1995 | Honnigford et al. |
| 5,532,645 A | 7/1996 | Fagnani et al. |
| 5,619,115 A | 4/1997 | Kajita |
| 5,825,218 A | 10/1998 | Colli et al. |
| 6,169,886 B1 | 1/2001 | Black et al. |
| 6,194,886 B1 * | 2/2001 | D'Aquino et al. .......... 323/315 |
| 6,316,972 B1 * | 11/2001 | Koffmane et al. .......... 327/132 |
| 6,356,151 B1 | 3/2002 | Nalbant |
| 6,369,626 B1 | 4/2002 | Donnelly et al. |
| 6,392,486 B1 * | 5/2002 | Lemay, Jr. .................. 330/253 |
| 6,414,537 B1 * | 7/2002 | Smith .......................... 327/540 |

* cited by examiner

Primary Examiner—My-Trang Nu Ton
(74) Attorney, Agent, or Firm—Freedman & Associates

(57) ABSTRACT

A circuit for controlling a high frequency power amplifier for amplifying a signal for wireless transmission is disclosed. The circuit provides a control signal to the power amplifier at an output port thereof. The control signal has properties of rise time and fall time, where a delayed transition in this signal is based on charging and discharging of the capacitor using two current mirror circuits in order to provide the delayed transition. An advantage lies in that the time of this delayed transition is dependent primarily upon the current mirrors and substantially other than dependent upon the RC time constant of the circuit.

22 Claims, 4 Drawing Sheets

RAMP CIRCUIT TO REDUCE SPECTRAL REGROWTH OF POWER AMPLIFIERS

FIELD OF THE INVENTION

This invention relates to the area of power amplifier control circuits and more specifically to the area of power amplifier integrated control circuits for use in wireless applications.

BACKGROUND OF THE INVENTION

Wireless connectivity between electronic devices is gaining popularity as wireless enabling technologies, such as Bluetooth ™ and IEEE 802.11b are integrated into an increasing amount of devices. Transceivers that comply with the Bluetooth ™ wireless specification operate in an unlicensed, 2.4 GHz radio spectrum thus ensuring communication compatibility worldwide. These transceivers use a spread spectrum, frequency hopping, full-duplex signal at up to 1600 hops/sec. The signal hops among 79 frequencies at 1 MHz intervals and therefore provides a high degree of interference immunity while communicating using wireless technology.

In order for wireless devices to communicate, transmitters provide a communication signal to a receiver. Within these wireless devices, such as those using Bluetooth™, there are power amplifiers for amplifying a signal to a desired power level before they are broadcast through a transmitter antenna of the wireless transceiver. Power amplifiers are used for amplifying low intensity, low amplitude electrical signals in order to produce a higher power and higher amplitude amplified output signal. Depending on the amount of gain provided by the amplifier, the amplifiers usually dominate power consumption of the transceiver.

Power amplifier performance is judged under realistic operating conditions in terms of Adjacent Channel Power Ratio (ACPR) measurement. Prior to taking an ACPR measurement, a signal residing in a desired frequency channel is modulated using a digital modulation scheme, such as that set forth in adherence to the IEEE 802.11b modulation standard and output power in an adjacent channel, with respect to the desired frequency channel, is measured. The ACPR is a ratio of electrical power in a desired frequency channel compared to that in another adjacent channel, thus giving an indication of frequency spreading of the modulated input channel. If the ACPR is high then there is no energy in the adjacent channel. If spectral re-growth occurs—where electrical power is injected in frequency bands adjacent to the modulated input channel—then the ACPR is reduced.

When switching power amplifiers (PAs) on and off the switching causes "spectral splatter." Spectral splatter is the generation of energy in adjacent channels. This spectral splatter is harmful especially for radio communication equipment that uses a narrow channel bandwidth. Skirts showing up in the adjacent channel as a result of modulation may affect sensitivity of radio reception. One way to reduce spectrum re-growth is to have gradual rising and falling switching edges, thereby eliminating high frequencies that are associated with sharp modulation transition edges.

Delay circuits, which can be used for providing gradual rising and falling switching edges, using resistor and capacitor networks and are known in the prior art. For instance: in U.S. Pat. No. 4,983,931, a resistor divider network is used to charge and discharge a capacitor. U.S. Pat. No. 5,108,133 provides a ramp circuit used for providing an EEPROM programming signal. U.S. Pat. No. 5,523,645 provides a circuit used for regulating a charge time of an output node of an amplifier on start up. U.S. Pat. No. 5,619,115 uses a current limiting circuit to charge and discharge a capacitor for purposes of charge integration. U.S. Pat. No. 5,825,218 discloses a voltage ramp generator used for discharging of a capacitor in two stages, where a discharging current source discharges the capacitor from a maximum voltage the capacitor reaches down to a low voltage above ground potential, where another discharging current source discharges the capacitor from the low voltage reached by the first source to ground. U.S. Pat. No. 6,369,626 uses a low pass filter circuit coupled to a capacitor for use in a delay lock loop circuit. Unfortunately these circuits are typically not geared towards amplifiers and more particularly feature longer rise times and fall times and would therefore not be useable for wireless applications. U.S. Pat. No. 6,169,886 a power amplifier output power level is controlled using a ramp circuit for use in amplifying an input signal of varying input power levels. However, the ramp used within this circuit is more applicable to signals having varying input power levels and not for amplitude modulating of the signal.

The longer the rise time or the fall time of a power amplifier the larger the reduction in spectral re-growth, however it is known to those of skill in the art that longer rise times and fall times are not conducive to fast data transmission rates. Some applications like Bluetooth ™ require rise times and fall times in the order of 2~4$\mu$s, while other applications need shorter rise times and fall times.

It is therefore an object of the invention to provide a ramping circuit for use in amplitude modulation of a power amplifier in wireless applications in order to reduce spectrum re-growth occurring in an adjacent wireless channel as a result of amplitude modulation.

SUMMARY OF THE INVENTION

In accordance with the present invention there is provided a circuit for controlling a high frequency power amplifier for amplifying a signal for wireless transmission comprising: an output port, a capacitor electrically coupled to the output port, a current source-sink coupled with the capacitor for providing current thereto and sinking current therefrom, the current source operable in a first state mode to charge the capacitor and operable in a second state mode to discharge the capacitor, wherein, in use, a transition between said the first modestate and the said second state mode results in a delayed transition of an output signal at the output port between first and second output signal levels having a delay transition time of the delayed transition being other than substantially related to an RC time constant of the circuit.

In accordance with an embodiment, the circuit is absent a resistor in series with the capacitor for forming an RC circuit.

In accordance with an embodiment, the circuit is for use in a BlueTooth™ wireless transmitter.

In accordance with another embodiment of the invention there is provided a circuit for controlling a high frequency power amplifier for amplifying a signal for wireless transmission comprising: an input port for receiving a first input signal for amplification thereof; an output port; a control port for receiving a control signal; a capacitor electrically coupled to the control port for providing a control signal thereto in dependence upon a charge on the capacitor; a source current mirror electrically coupled with the capacitor and a sink current mirror electrically coupled with the capacitor, the source and sink current mirrors for providing current to the capacitor and sinking current therefrom, the current mirrors operable in a first mode to charge the capacitor and operable in a second mode to discharge the capacitor; and, a power amplifier circuit coupled to the first input port for receiving the first input signal and for amplifying the first input signal in dependence upon the control signal, the amplified first input signal forming the output signal and provided at the output port; wherein, in use, a transition between said the first mode and the second mode results in a delayed transition of the control signal at the control port between first and second control signal levels, with a transition time the delayed transition being other than substantially related to an RC time constant of the circuit.

In accordance with another aspect of the invention there is provided a method of modulating a power amplifier output signal level comprising the steps of: providing a capacitor; receiving a control signal having one of a first level and a second level; initiating a charging of said capacitor at a linear rate when said control signal changes from the second level to the first level; varying the power amplifier output signal level from minimum level to a maximum level during a linear charging of said capacitor, where a time taken for said charging is a first transition time; initiating a discharge of said capacitor at the linear rate when said control signal changes from the first level to the second level; and, varying the power amplifier output signal level from the maximum level to the minimum level during a linear discharging of said capacitor, where a time taken for said charging is a second transition time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
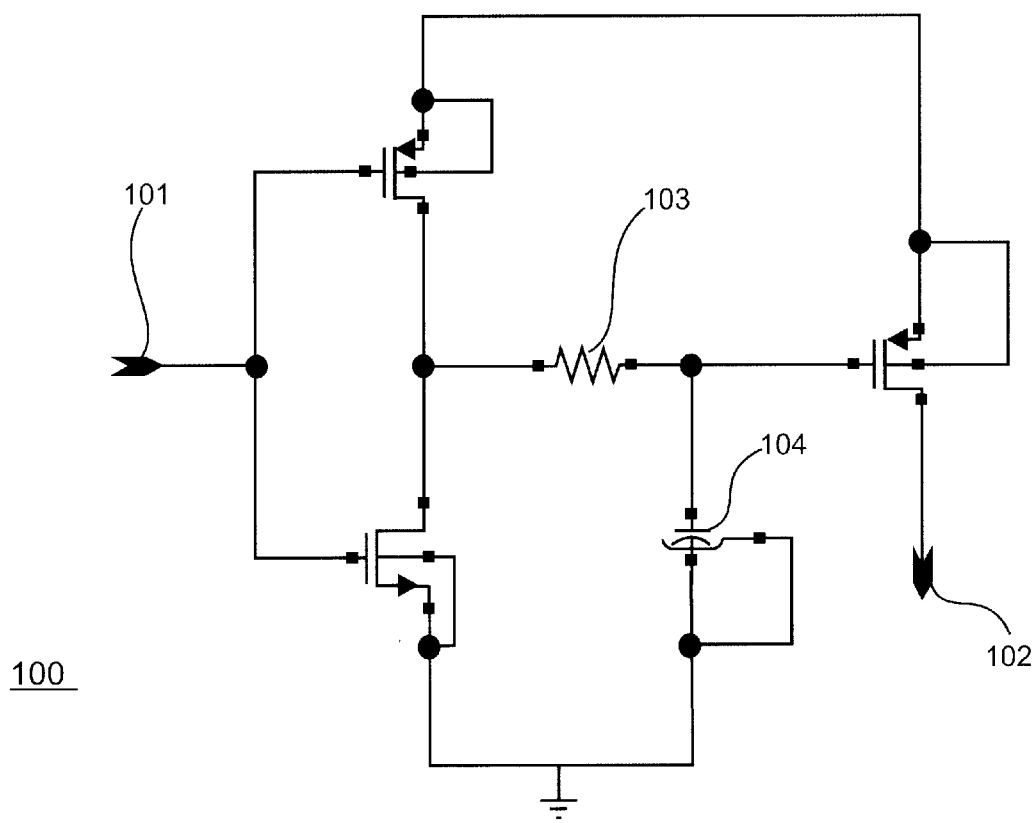
FIG. 1 illustrates a typical prior art conventional power amplifier ramp control circuit.

FIG. 1 illustrates a prior art conventional power amplifier ramp control circuit 100, wherein based on an enable voltage applied to an enable input port 101, a Vcc supply voltage is applied to a power amplifier circuit (PA) (not shown) through an output port 102. Within this circuit there is a resistor 103 and a capacitor 104 forming a resistor-capacitor (RC) circuit. The RC circuit within circuit 100 causes a delayed output voltage applied to the PA in response to an enable voltage ($V_{en}$) applied to the enable input port. The amount of delay is dependent on values predetermined for RC network used to implement such functionality. This delay controls a rise time and a fall time of this circuit 100 in response to $V_{en}$. The rise time is defined as an amount of time taken between a minimum predetermined supply voltage being applied to the PA circuit and a maximum predetermined supply voltage being applied to the PA, in response to a transition in $V_{en}$. The fall time is defined as an amount of time taken between a maximum predetermined supply voltage being applied to the PA and a minimum predetermined supply voltage being applied to the PA, in response to the transition in $V_{en}$. The transition in $V_{en}$ defined as either a transition from a logic HI to a logic LO level, or a transition from a logic LO to a logic HI level. It is known to those of skill in the art that when the PA is utilized in conjunction with Bluetooth™ transmitter applications rise times or fall times within 1~2µs are preferred. Of course, for other applications longer or shorter rise times and fall times may be preferable.

Unfortunately, using such a circuit is non-advantageous. There are two issues associated with the use of the RC network that render their use problematic. Firstly, it is known to those of skill in the art that RC networks have a RC time constant associated therewith, where a delay in an output signal rise and fall time of the RC network is dependent on an exponential function of the time constant. Secondly, in order to attain the preferred 2µs rise/fall time, the RC time constant needs to be around 1µs. In order to achieve this preferred time constant a 5pF capacitor is selected with a 200Ω resistor within the RC network. Of course, other combinations of resistors and capacitors will also work to attain the same time constant as would be apparent to those of skill in the art.

It is also apparent to those of skill in the art that laying out of this circuit 100 on a die to form an integrated circuit typically requires a large amount of space on the die. Resistors and capacitors are known to occupy a large amount of space in integrated circuits, where capacitors are the worst offenders, occupying the most space, followed by resistors. Depending on the ramping time required, using an RC network is not optimal since a large amount of space will be utilized in order to lay these components out on the die, especially when longer delay times are required and larger RC values are utilized for larger time constants. Having a larger die also increases device cost since less devices are fit onto a same wafer.

Figure 2A:
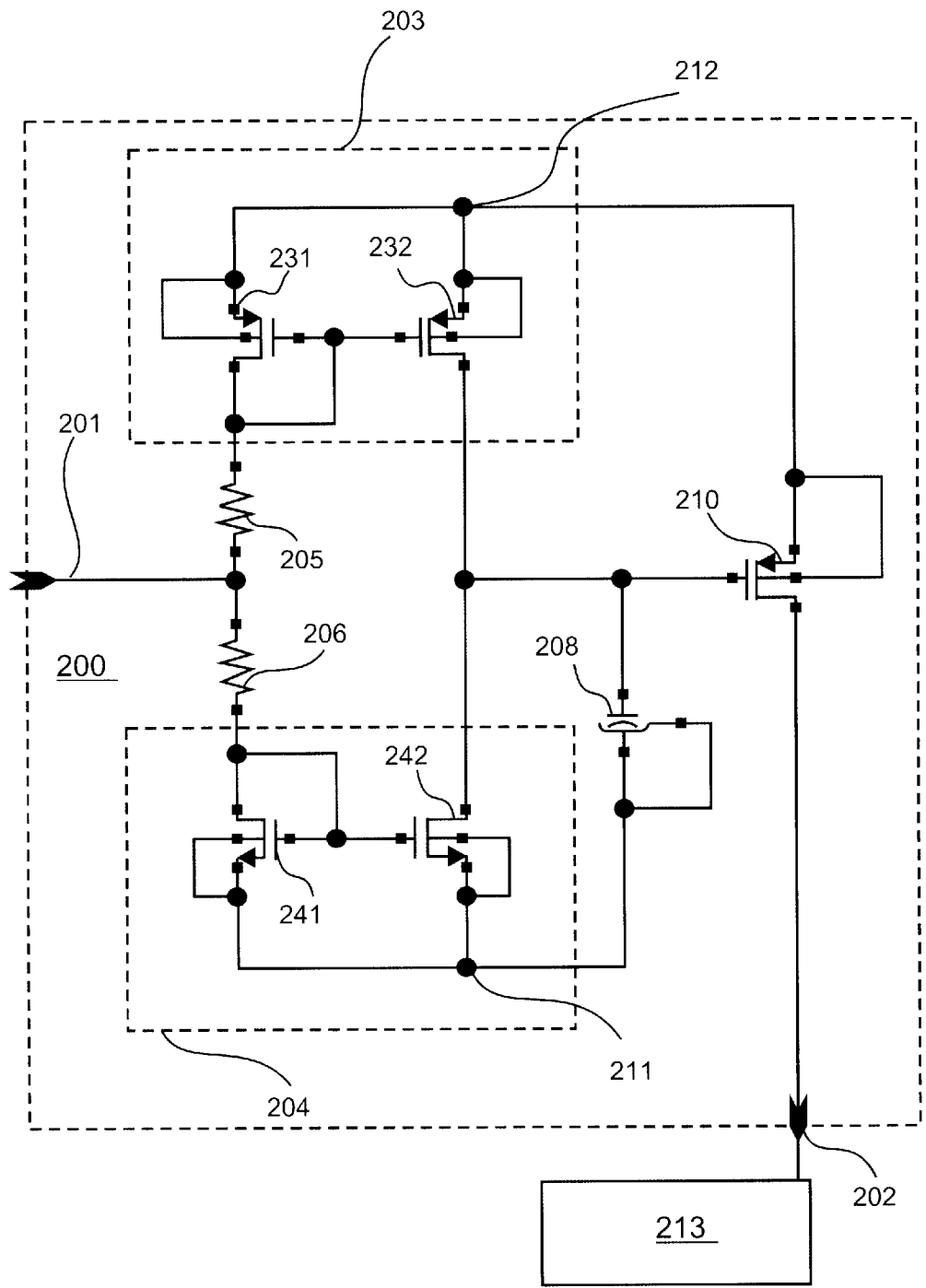
FIG. 2a illustrates a novel ramp circuit in accordance with a preferred embodiment of the invention and FIG. 2b illustrates a variation of the preferred embodiment of the invention; and,.

FIG. 2a illustrates a preferred embodiment of the ramp circuit 200. This ramp circuit 200 preferably combines a ramping function and power amplifier power supply functionality within a single integrated circuit that significantly reduces die area requirements, especially when long delay times are required. In the embodiment of FIG. 2a, the reduced circuit size is a result of two current mirrors utilized within the circuit for providing a required delay.

Figure 2B:
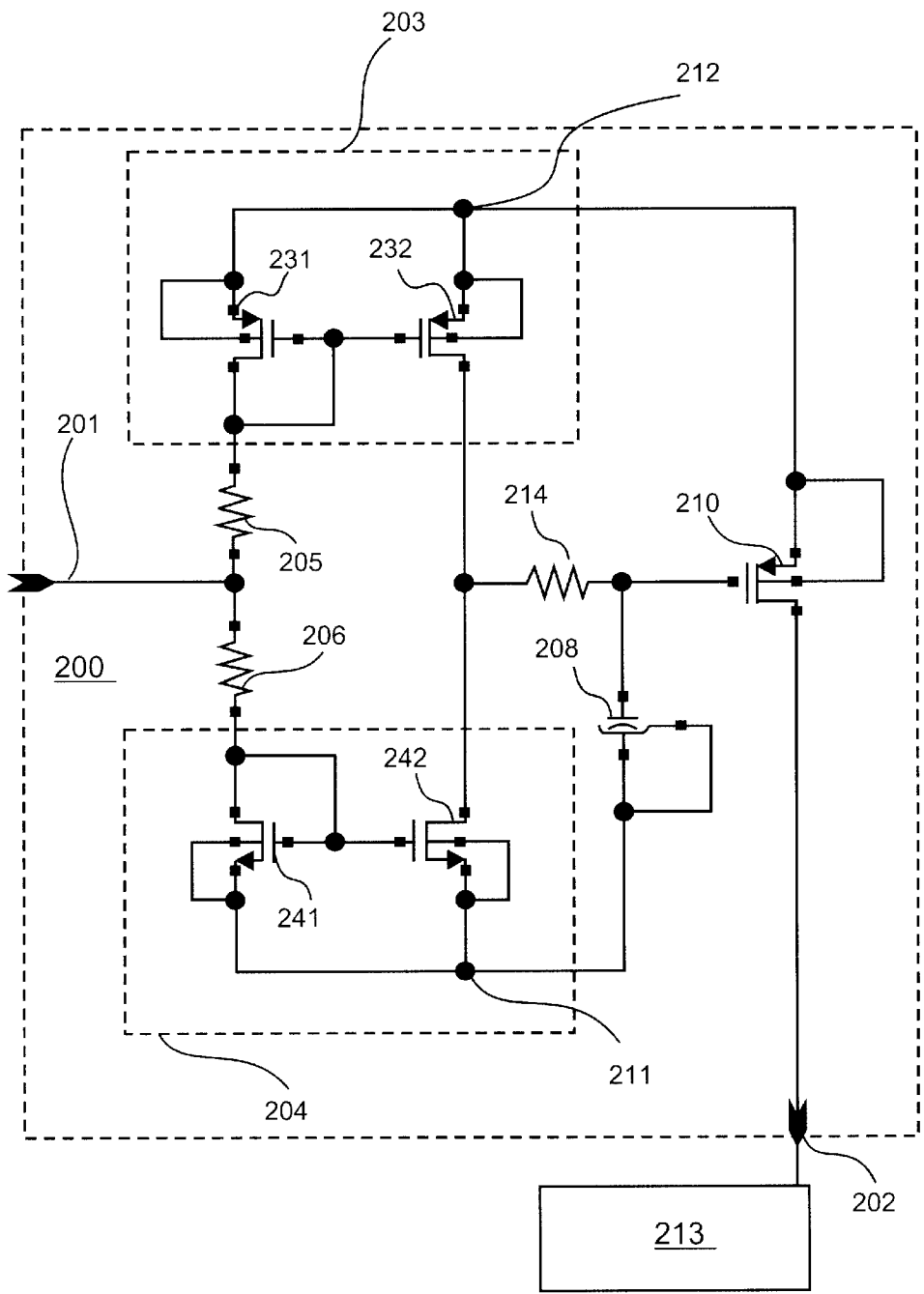

Based on an enable voltage (Ven), or control signal, applied to an enable input port 201 a PA supply voltage (Vcc) is applied to a power amplifier circuit (PA) 213 through an output port 202. Within the ramp circuit 200 there is a current source-sink in the form of an upper current mirror 203 and a lower current mirror 204. The upper current mirror 203 comprises a first PMOS transistor 231 and a second PMOS transistor 232. The lower current mirror 204 comprises a first NMOS transistor 241 and a second NMOS transistor 242. Ven is provided to the upper current mirror first PMOS transistor 231 drain through an upper resistor 205 and to the lower current mirror first NMOS transistor 241 drain through a lower resistor 206. The second PMOS transistor 232 drain and the second NMOS transistor 242 drain are coupled to a common node. A capacitor is provided in parallel with the second NMOS transistor 242 drain and source, with the common node coupled to a gate of a PMOS output transistor 210. A positive supply voltage is provided to the ramp circuit 200 through a positive input port 212 and a ground potential is applied to the ramp circuit 200 through a ground input port 211. The PMOS output transistor 210 has its source coupled to the positive input port 212 and its drain coupled to the output port 202. FIG. 2b illustrates a variation of the preferred embodiment of the invention, where in this variation a small resistance 214 is disposed between the common node and the gate of a PMOS output transistor 210 and in series with the capacitor 208.

In use, when $V_{en}$ is LO, at a first level, the upper PMOS current mirror 203 is active, thereby operating in a first mode by charging the capacitor 208 at a linear rate until an upper limit, second output signal level, is reached. During this time the PA is enabled having its output controlled by a ramp signal caused by charging of the capacitor. This charging of the capacitor causes the PA output power to ramp from a minimum level to a maximum level in a transition time controlled by the current mirror 203 and the capacitor 208. When $V_{en}$ is HI, at a second level, the lower NMOS current mirror 204 is active, thereby operating in a second mode by discharging the capacitor at a linear rate until a lower limit, first output signal level is reached. During this time the PA is enabled, with its output power controlled by the ramp signal. This discharging of the capacitor results in the PA output power to ramp from the maximum level to a minimum level in a time controlled by the current mirror 204 and the capacitor 208. The rise time and the fall time are determined by a charge and discharge current of the capacitor. The charge and discharge current of the capacitor is selected by choosing values for the resistors and the ratio of the current mirror currents.

Figure 3:
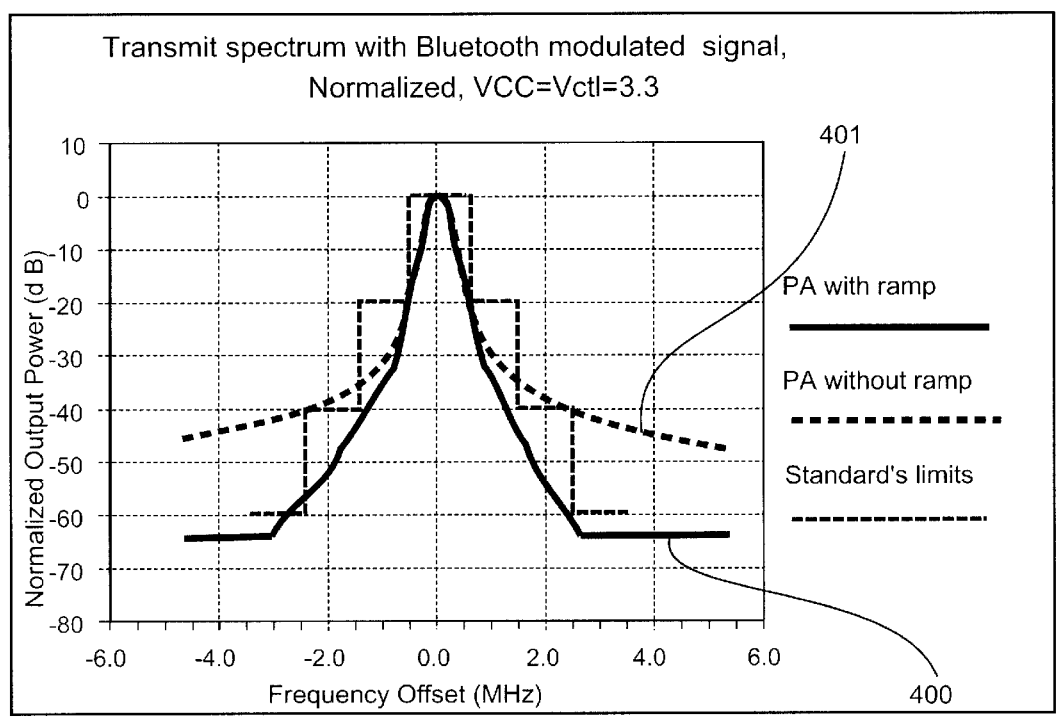
FIG. 3 illustrates output spectra of the power amplifier being operated using the conventional power amplifier control circuit and being operated using the ramp circuit in accordance with the preferred embodiment.

FIG. 3 illustrates output spectra of the PA being operated using the conventional power amplifier control circuit 100 and being operated using the ramp circuit 200 in accordance with the preferred embodiment. A standard requirement is also provided on this graph to act as a guide in order to illustrate a preferred Bluetooth™ channel profile in accordance with a predetermined specification. As can be seen from this graph it is evident that operating the PA using the circuit 100 without ramp functionality results in the modulated channel profile falling outside of the requirements, such that in the adjacent channels a power level is approximately 6 dB higher for this signal without using the ramp circuit 200. The conventional circuit also provides for a maximum amplifier gain difference of approximately 45 dB, as opposed to over 60 dB realized when using the preferred embodiment. This modulated channel causes spectral splatter in adjacent channels and for low adjacent channel modulation powers may cause erroneous information.

Advantageously, by using the new ramp circuit a voltage at the capacitor rises and falls linearly with a charge and discharge current that is predetermined by the current mirrors. An approximately symmetric rise and fall time is achievable without experiencing extra settling for the power amplifier when reaching the supply voltage, an important requirement for some applications. Another advantage of using the new ramp circuit is that a size of the capacitor can be greatly reduced by choosing a ratio of current mirror parameters. Advantageously, since the capacitor size is reduced the die area used by components making up the ramp circuit is also reduced, thereby offering a decreased device cost as a result of being able to manufacture more devices per wafer. Of course, the resistor is also variable to facilitate ramp circuit operation. It is also clear to those of skill in the art that the ramping circuit is not only useable in wireless application, such as those employing Bluetooth™, but also for use in cellular telephones amplifiers.

Numerous other embodiments may be envisaged without departing from the spirit or scope of the invention.

What is claimed is:

1. An integrated circuit for controlling a high frequency power amplifier for amplifying a signal for wireless transmission comprising:

an output port;

an integrated capacitor electrically coupled to the output port and absent a comparator circuit coupled thereto; and, an integrated current source-sink coupled with the integrated capacitor for providing current thereto and sinking current therefrom, the integrated current source-sink operable in a first mode to charge the integrated capacitor and operable in a second mode to discharge the integrated capacitor;

wherein, in use, a transition between said first mode and said second mode results in a delayed transition of an output signal at the output port between first and second output signal levels having a transition time of the delayed transition being substantially unrelated to an RC time constant of the integrated circuit.

2. An integrated circuit according to claim 1, wherein the integrated circuit is absent a substantial resistance in series with the integrated capacitor, such that the delay time is substantially dependent on a capacitance of the integrated capacitor and a current of the integrated current source-sink.

3. An integrated circuit according to claim 1, wherein said time constant is dependent on a small integrated resistor in series with the capacitor, said integrated resistor being small in value such that said time constant is substantially dependent on a capacitance of the integrated capacitor and a current of the integrated current source-sink.

4. An integrated circuit according to claim 1, wherein said integrated current source-sink comprises an upper current mirror integrated circuit coupled to the integrated capacitor for charging thereof.

5. An integrated circuit according to claim 4, wherein said integrated current source-sink comprises a lower current mirror integrated circuit coupled to the integrated capacitor for discharging thereof.

6. An integrated circuit according to claim 5, wherein said upper current mirror integrated circuit comprises:

first and second PMOS transistors and said lower current mirror integrated circuit comprises:

first and second NMOS transistors.

7. An integrated circuit according to claim 4, wherein said upper current mirror integrated circuit comprises:

first and second PMOS transistors.

8. An integrated circuit according to claim 1, wherein said integrated current source-sink and said integrated capacitor occupying an area smaller than an area of an RC circuit for supporting a same delay.

9. An integrated circuit according to claim 1, wherein said integrated capacitor comprising a resistance in series therewith other than configured to form a low pass filter within the integrated circuit.

10. An integrated circuit according to claim 1, comprising:

an input port for receiving a control signal for selecting between current source/sink state.

11. An integrated circuit according to claim 10, comprising:

an integrated power amplifier circuit coupled to the output port for receiving the output signal and for varying a power supply voltage provided to said integrated power amplifier circuit in dependence upon the control signal.

12. An integrated circuit according to claim 11, wherein the integrated power amplifier is for use in a BlueTooth™ wireless transmitter.

13. An integrated circuit according to claim 1, wherein the delay time is approximately equal in time for a transition from first to second output signal levels as for a transition from second to first output signal levels.

14. An integrated circuit according to claim 13, wherein the transition time is between 1 and 2 microseconds.

15. A method of modulating a power amplifier output signal level comprising the steps of:
   providing a capacitor;
   receiving a control signal having one of a first level and a second level;
   initiating a charging of said capacitor at a linear rate when said control signal changes from the second level to the first level;
   varying the power amplifier output signal level from minimum level to a maximum level during a continuous linear charging of said capacitor, where a time taken for said charging is a first transition time;
   initiating a discharge of said capacitor at the linear rate when said control signal changes from the first level to the second level; and,
   varying the power amplifier output signal level from the maximum level to the minimum level during a continuous linear discharging of said capacitor, where a time taken for said charging is a second transition time.

16. A method according to claim 15, comprising the step of:
   providing an input signal to said power amplifier;
   amplifying said input signal using an approximately maximal gain of said power amplifier when operating at the maximum level.

17. A method according to claim 16, comprising the step of:
   providing an input signal to said power amplifier;
   attenuating said input signal using an approximately maximal attenuation of said power amplifier when operating at the minimum level.

18. A method according to claim 15, comprising the step of:
   providing an input signal to said power amplifier;
   attenuating said input signal using an approximately maximal attenuation of said power amplifier when operating at the minimal level.

19. A method according to claim 15, wherein the first transition time and the second transition time are approximately equal.

20. A method according to claim 19, wherein the first transition time and the second transition time are between 1 and 2 microseconds.

21. A method according to claim 15, wherein the amplifier is for use in amplifying a signal for transmission via a wireless communication medium.

22. An integrated circuit for amplifying a signal for wireless transmission comprising:
   a first input port for receiving a first input signal for amplification thereof;
   an output port;
   a control port for receiving a control signal;
   an integrated capacitor electrically coupled to the control port for providing a control signal thereto in dependence upon a charge on the integrated capacitor and absent a comparator circuit coupled thereto;
   an integrated source current mirror electrically coupled with the capacitor and integrated therewith;
   an integrated sink current mirror electrically coupled with the integrated capacitor, the integrated source and sink current mirrors for providing current to the integrated capacitor and sinking current therefrom, the integrated current mirrors operable in a first mode to charge the integrated capacitor and operable in a second mode to discharge the integrated capacitor; and,
   an integrated power amplifier circuit coupled to the first input port for receiving the first input signal and for amplifying the first input signal in dependence upon the control signal, the amplified first input signal forming the output signal and provided at the output port;
   wherein, in use, a transition between said the first mode and the second mode results in a delayed transition of the control signal at the control port between first and second control signal levels, with a transition time of the delayed transition being substantially unrelated to an RC time constant of the integrated circuit.

* * * * *